(12) United States Patent
Makie

(10) Patent No.: US 9,997,750 B2
(45) Date of Patent: Jun. 12, 2018

(54) BATTERY ADAPTER WITH FLEX CIRCUIT AND SILICONE SPRING

(75) Inventor: Francis Kusti Makie, Melrose, MA (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days. days.

(21) Appl. No.: 13/980,661

(22) PCT Filed: Jan. 20, 2012

(86) PCT No.: PCT/IB2012/050278
§ 371 (c)(1),
(2), (4) Date: Jul. 19, 2013

(87) PCT Pub. No.: WO2012/101557
PCT Pub. Date: Aug. 2, 2012

(65) Prior Publication Data
US 2013/0295429 A1    Nov. 7, 2013

Related U.S. Application Data

(60) Provisional application No. 61/435,847, filed on Jan. 25, 2011.

(51) Int. Cl.
*H01M 2/10* (2006.01)
*H05K 13/00* (2006.01)
(Continued)

(52) U.S. Cl.
CPC ....... *H01M 2/1022* (2013.01); *H01M 2/1055* (2013.01); *H01M 4/1397* (2013.01);
(Continued)

(58) Field of Classification Search
None
See application file for complete search history.

(56) References Cited

U.S. PATENT DOCUMENTS

| 3,992,225 A | 11/1976 | Sykes |
| 5,294,497 A | 3/1994 | Muramatsu |
| (Continued) | | |

FOREIGN PATENT DOCUMENTS

| EP | 0144771 A2 | 6/1985 |
| JP | H07296786 A | 11/1995 |
| (Continued) | | |

*Primary Examiner* — Ol K Conley

(57) ABSTRACT

A battery adapter (100) and method (800) of making the same. The battery adapter (100) includes a resilient tray (102) that defines a receiving area (104) for one or more batteries (106) and includes one or more resilient sidewalls (108) of a resilient material configured to be compressed by the batteries (106). The battery adapter (100) further includes a flexible circuit (132) wrapped around at least a portion of an exterior of the resilient tray (102) over the resilient sidewalls (108). The flexible circuit (132) includes a first set of one or more contacts (138) disposed on the exterior of the resilient tray (102) to deliver power to an associated device (150) and a second set of one or more contacts (136) electrically coupled with the first set of contacts (138). The second set of contacts (136) is disposed on an interior of the resilient sidewalls (108) in the battery receiving area (104).

12 Claims, 4 Drawing Sheets

(51) Int. Cl.
*H01M 4/1397* (2010.01)
*H01M 2/20* (2006.01)

(52) U.S. Cl.
CPC ............... *H05K 13/00* (2013.01); *H01M 2/20* (2013.01); *Y10T 29/49002* (2015.01)

(56) References Cited

U.S. PATENT DOCUMENTS

| | | | |
|---|---|---|---|
| 5,472,804 A | | 12/1995 | Austin et al. |
| 6,632,538 B1 * | | 10/2003 | Yamazaki ............. H01M 2/021 428/213 |
| 2005/0189139 A1 * | | 9/2005 | Stole ............................ 174/260 |
| 2011/0180291 A1 | | 7/2011 | Matthias et al. |

FOREIGN PATENT DOCUMENTS

| | | | |
|---|---|---|---|
| JP | 09097599 A | | 4/1997 |
| JP | 2000208118 A | | 7/2000 |
| JP | 2004095195 A | | 3/2004 |
| WO | 2005039012 A2 | | 4/2005 |
| WO | 2010099355 A2 | | 9/2010 |

* cited by examiner

BATTERY ADAPTER WITH FLEX CIRCUIT AND SILICONE SPRING

CROSS REFERENCE TO RELATED APPLICATIONS

This application is a national filing of PCT application Ser. No. PCT/IB2012/050278, filed Jan. 20, 2012, published as WO 2012/101557 A1 on Aug. 2, 2012, which claims the benefit of U.S. provisional application Ser. No. 61/435,847 filed Jan. 25, 2011 which is incorporated herein by reference.

The present application relates generally to battery packs. It finds particular application in conjunction with battery adapters for patient worn devices, and will be described with particular reference thereto. However, it is to be understood that it also finds application in other usage scenarios, such as scenarios in which equipment needs to be cleaned, disinfected, biologically or chemically decontaminated, or the like, and is not necessarily limited to the aforementioned application.

A battery adapter is an interface between one or more batteries and electronic equipment that it powers. To make good electrical contact with the batteries, known battery adapters typically employ metal spring contacts for interfacing with the batteries. However, there are a number of problems with employing metal spring contacts, especially for medical applications.

Metal spring contacts are bulky and add unnecessary expense to an adapter. Even more, the exposed area of metal springs contacts is unnecessarily large, which increases the likelihood of one receiving a shock from associated batteries. In addition to being painful, this can be dangerous to medical patients attached to sensitive electronic components, such as patient monitors, respirators, and the like, and/or individuals with electronic medical implants, such as pacemakers.

Further, cleaning a battery adapter is difficult with metal spring contacts. Contaminates can become entrapped and inaccessible for cleaning While this may not be problematic for most applications, this is unacceptable with medical institutions, such as hospitals, which require sterile environments. Germs can become lodged in crevices under spring contacts and the like. Moreover, disinfectants are often strong chemicals, e.g., strong oxidants, that can corrode exposed metal.

The present application provides new and improved systems and methods which overcomes the above-referenced problems and others.

In accordance with one aspect, a battery adapter is provided. The battery adapter includes a resilient tray that defines a receiving area for one or more batteries and includes one or more resilient sidewalls of a resilient material configured to be compressed by the batteries. The battery adapter further includes a flexible circuit wrapped around at least a portion of an exterior of the resilient tray over the resilient sidewalls. The flexible circuit includes a first set of one or more contacts disposed on the exterior of the resilient tray to deliver power to an associated device and a second set of one or more contacts electrically coupled with the first set of contacts. The second set of contacts is disposed on an interior of the resilient sidewalls in the battery receiving area.

In accordance with one another aspect, a method of manufacturing a battery adapter is provided. A flexible circuit including a first set of one or more contacts and a second set of one or more contacts electrically coupled with the first set of contacts is formed. A resilient tray including a resilient material that defines a receiving area for one or more batteries is formed. The resilient material is compressible when batteries are inserted in the receiving area. The flexible circuit is wrapped around at least a portion of an exterior of the resilient tray into a portion of the battery receiving area such that the second set of contacts are disposed in the battery receiving area and the first set of contacts are disposed on the exterior of the resilient tray.

In accordance with one another aspect, a receiving device is provided. The receiving device includes a receiving area to receive a battery adapter. The battery adapter includes a resilient tray that defines a receiving area for one or more batteries and includes one or more resilient sidewalls of a resilient material configured to be compressed by the batteries. The battery adapter further includes a flexible circuit wrapped around at least a portion of an exterior of the resilient tray over the resilient sidewalls. The flexible circuit include a first set of one or more contacts disposed on the exterior of the resilient tray to deliver power to the receiving device and a second set of one or more contacts electrically coupled with the first set of contacts. The second set of contacts is disposed on an interior of the resilient sidewalls in the battery receiving area.

One advantage resides in the low profile and connection method that saves space.

Another advantage resides the use of materials that have superior chemical resistance.

Another advantage resides in the reduction of the areas where germs and residual chemicals can become entrapped.

Another advantage resides in the ability to be easily clean.

Another advantage resides in the reduced surface area of the contacts.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
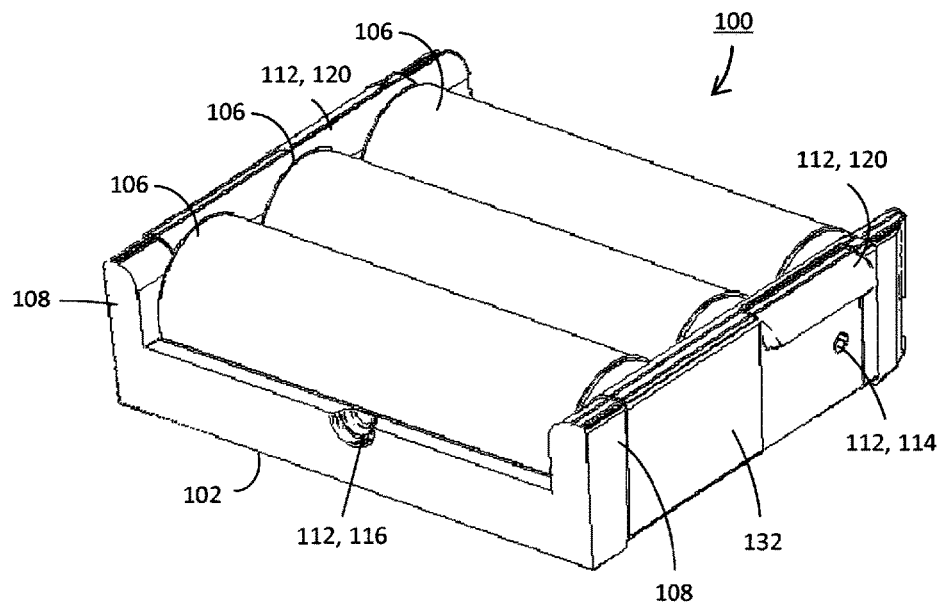
FIG. 1 is perspective view of a first side of a battery adapter with batteries according to aspects of the present disclosure.
Figure 2:
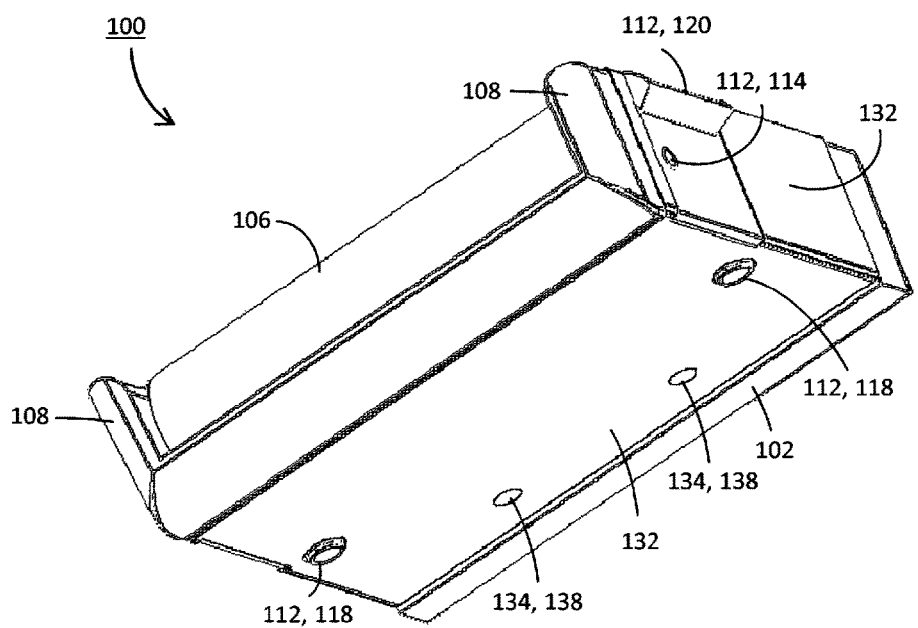
FIG. 2 is a perspective view of a second side/bottom of a battery adapter with batteries according to aspects of the present disclosure.

With reference to FIGS. 1 and 2, an embodiment of a battery adapter 100 according to aspects of the present disclosure is illustrated. FIG. 1 illustrates a perspective view of a first side of the battery adapter 100, and FIG. 2 illustrates a perspective view of a second side, opposite the first side, of the battery adapter 100.

Figure 3:
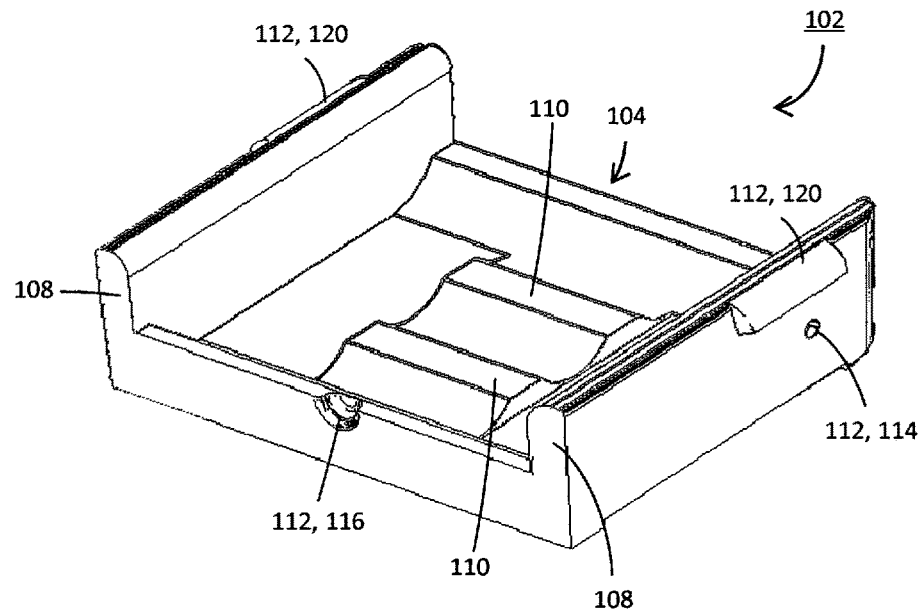
FIG. 3 is a perspective view of a resilient tray according to aspect of the present disclosure.

A resilient tray 102 of the battery adapter 100 defines a receiving area 104 for receiving one or more batteries 106, such as AA batteries and/or rechargeable batteries. So as to make contact with terminals of the batteries 106, the resilient tray 102 suitably includes one or more resilient silicon sidewalls 108. As shown, the batteries 106 extend longitudinally between the resilient sidewalls 108, e.g., of silicon or another resilient polymer. The resilient sidewalls 108 create an interference fit designed to create a constant compression on the batteries 106. In certain embodiments, the resilient tray 102 includes one or more spacers 110 to space the batteries 106, as shown in FIG. 3. Additionally or alternatively, in certain embodiments, the resilient tray 102 includes one more features 112 facilitating alignment of the battery adapter 100 in a receiving device 150 (shown in FIGS. 6 and 7) and/or allowing the battery adapter 100 to be secured to the battery adapter 100. These features 112 include, but are not limited to, one or more of recesses and/or wells 114, 116, protrusions and/or detents 118, tabs 120, and the like.

As shown, opposing recesses and/or wells 114 (only one of which is visible) on the exterior of the resilient tray 102 allow the battery adapter 100 to be resiliently secured to the receiving device 150. Further, as shown, a recess and/or well 116 arranged on the same plane as the opposing recesses and/or wells 114 and along a normal bisecting an axis extending between the opposing recesses and/or wells 114 allows the battery adapter 100 to be secured to the receiving device 150 and facilitates alignment thereof. Moreover, protrusions and/or detents 118 along the bottom of the resilient tray 102 (as oriented in FIGS. 1 and 2) facilitate alignment of the battery adapter 100. Even more, opposing tabs 120 on the exterior of the resilient tray 102 allow the battery adapter 100 to be aligned in the receiving device 150.

Figure 4:
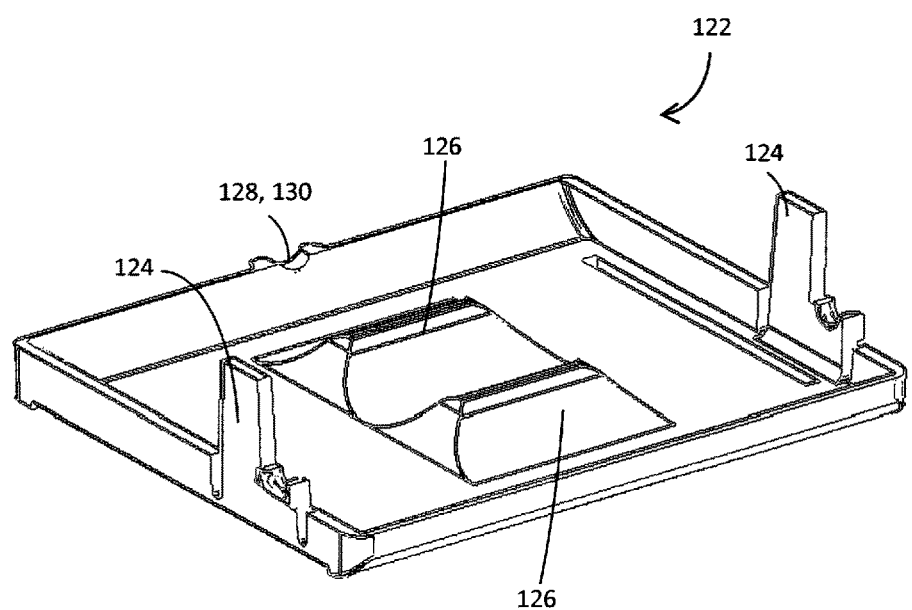
FIG. 4 is a perspective view of a rigid tray according to aspects of the present disclosure.

The resilient tray 102 is suitably formed from a flexible, compressible material, such as silicone. Silicone is advantageous due to its resistance to compression and its high chemical resistance. In certain embodiments, a rigid or stiff tray 122, shown in FIG. 4, is incorporated in the resilient tray 102, as a skeleton or backbone . In some embodiments, the resilient tray 102 is overmolded around the rigid tray 122 to form an integral flexible tray unit with more rigidity. The rigid tray 122 gives the resilient tray 102 rigidity that may be needed for certain applications and is suitably made from a chemically resistant thermoplastic material. For example, tabs 124 of the rigid or stiff tray 120 add rigidity to the resilient silicon sidewalls 108 of the resilient tray 102. Further, because the resilient tray 102 is overmolded around the rigid tray 122, it is contemplated that, in certain embodiments, the shape of the resilient tray 102 is wholly or partially defined by the rigid or stiff tray 122. For example, it is contemplated that the rigid tray 122 includes one or more spacers 126 defining partially or wholly the spacers 110 of the resilient tray 102. As another example, it is contemplated that the rigid tray 122 includes one more features 128 defining partially or wholly the features 112 of the resilient tray 102. The features 128 of the rigid tray 122 include, but are not limited to, one or more of recesses and/or wells, protrusions and/or detents 130, tabs, and the like.

Figure 5:
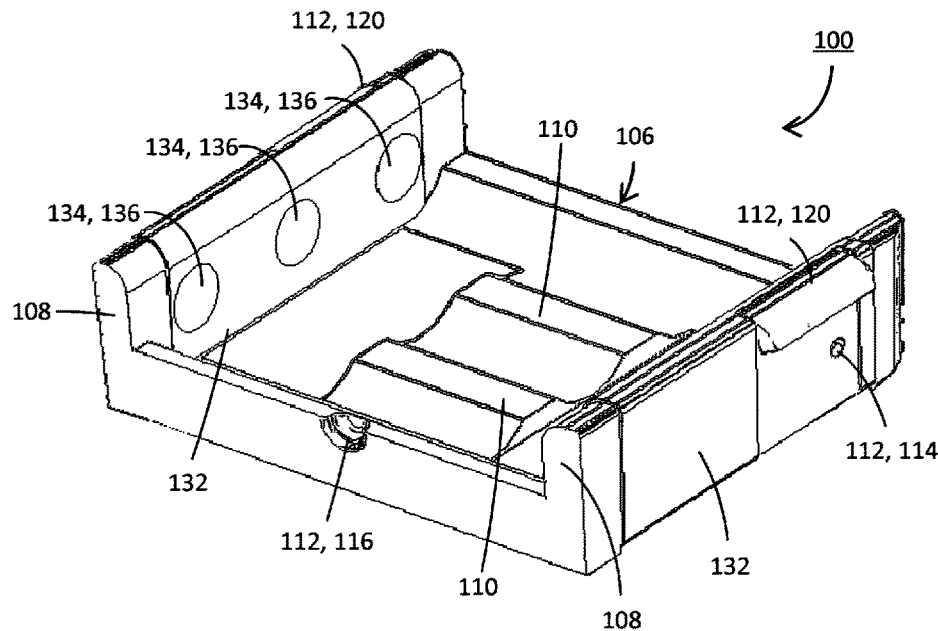
FIG. 5 is a perspective view of a battery adapter without batteries according to aspects of the present disclosure.

Extending over the exterior of the resilient tray 102 and into the interior thereof (shown in FIG. 5), a flexible circuit 132 of the battery adapter 100 connects the batteries 106 to the receiving device 150. In certain embodiments, tracings on the flexible circuit 132 connect the batteries 106 in series. To connect the batteries 106 to the receiving device 150, the flexible circuit 132 includes a plurality of contacts 134 electrically interconnected with the tracings. The plurality of contacts 134 are suitably disposed on a common side of the flexible circuit 132.

Battery contacts 136 of the plurality of contacts 134 connecting with the batteries 106 are suitably arranged on the resilient silicon sidewalls 108 within the interior of the battery adapter 100. The resilient sidewalls 108 compress allowing the contacts 136 to be pressed against terminals of the batteries 106 by the resiliency of the resilient sidewalls 108. Further, where the batteries 106 are arranged longitudinally between the resilient sidewalls 108, as shown, the cattery contacts 136 are suitably configured in pairs, where each member of a pair is oppositely disposed on a different one of the resilient sidewalls 108. Device contacts 138 of the plurality of contacts 134 connecting with the receiving device 150 are suitably arranged on the exterior of the battery adapter 100 and suitably include a positive contact and a negative contact. However, in certain embodiments, the device contacts 138 of the plurality of contacts 134 connecting with the receiving device 150 include more than two contacts, such as five contacts, for use with rechargeable ones of the batteries 106.

The flexible circuit 132, in one embodiment, includes a flexible substrate with elastically conductive pads defining the plurality of contacts 134. Tracings extend through the interior and/or along a rear surface of the flexible circuit 132. In another embodiment, electrical contact pads are plated onto or snap into the flexible circuit 132 to form the plurality of contacts 134. An adhesive layer on or applied to the rear surface of the flexible circuit 132 adheres the flexible circuit 132 to the base of the resilient tray 102 and/or the rigid tray 122, along the exterior of the resilient sidewalls 108, around the top edge of the resilient sidewalls 108, and along the interior layer of the resilient sidewalls 108. The adhesive is selected to provide a fluid tight seal between the flexible circuit 132 and the resilient tray 102 and/or the rigid tray 122 to prevent microbes from getting between the resilient tray 102 and/or the rigid tray 122 and the flexible circuit 132. Moreover, the adhesive is selected to be resistant to chemical disinfectants. Other adhering techniques such as solvent welding, thermal bonding, and the like are also contemplated. Alignment apertures in the flexible circuit 132 align with alignment projections of the resilient tray 102 and/or the rigid tray 122, such as the protrusions and/or detents 118 of the resilient tray 102, to position the flexible circuit 132 accurately.

Figure 6:
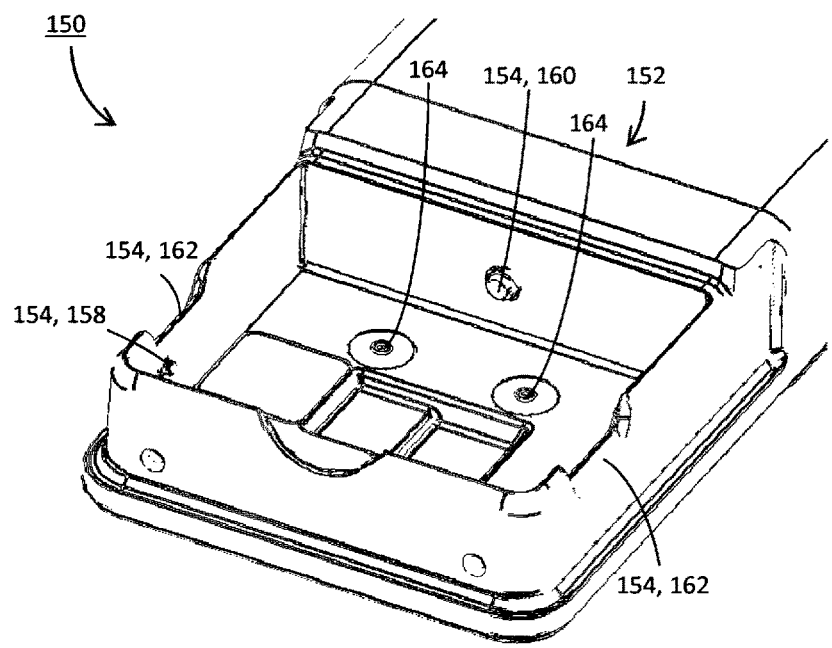
FIG. 6 is a perspective view of a portion of a receiving device which receives a battery adapter according to aspects of the present disclosure.
Figure 7:
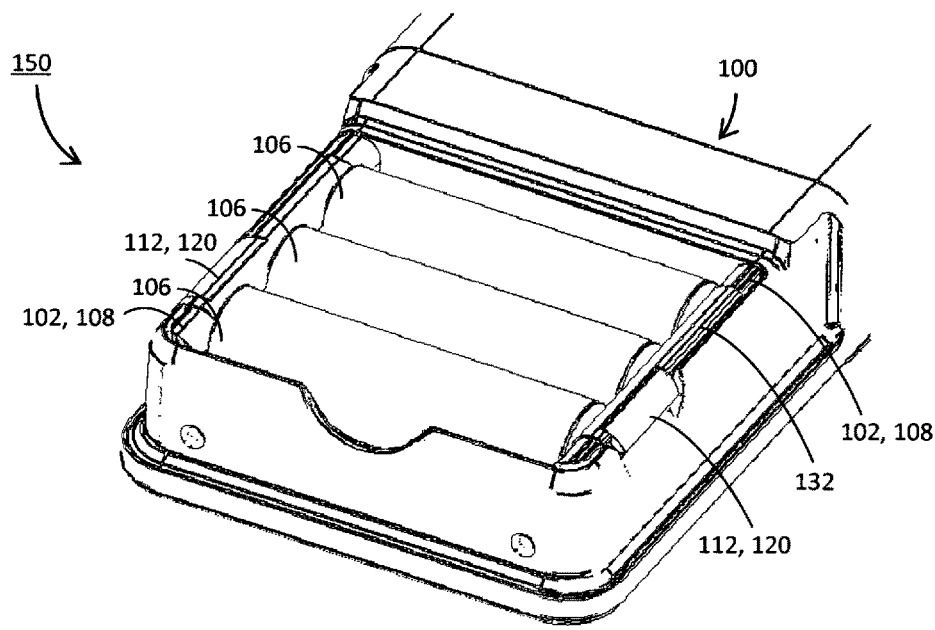
FIG. 7 is a perspective view of a portion of a receiving device with a battery adapter and batteries according to aspects of the present disclosure.

With reference to FIGS. 6 and 7, an embodiment of the receiving device 150 is provided. The receiving device 150 is typically a medical device, such as a patient worn monitor or other medical device, provisioned to receive the battery adapter 100. However, other devices provisioned to receive the battery adapter 100 are contemplated. FIG. 6 illustrates the receiving device 150 without the battery adapter 100 and FIG. 7 illustrates the receiving device 150 with the battery adapter 100.

The receiving device 150 includes a receiving area 152 for the battery adapter 100. In certain embodiments, the receiving area 152 includes one or more features 154 facilitating alignment of the battery adapter 100 therein and/or allowing the battery adapter 100 to be secured therein. These features 154 include, but are not limited to, one or more of recesses and/or wells, protrusions and/or detents 158, 160, cutouts 162, and the like.

As shown, opposing protrusions and/or detents 158 mate with the recesses and/or wells 114 of the battery adapter 100 to secure the battery adapter 100 within the receiving area 152 and facilitate alignment thereof. To insert and/or release the battery adapter 100, the resilient silicon sidewalls 108 thereof are elastically deformed. Even more, as shown, a protrusion and/or detent 160 arranged on the same plane as the opposing detents 158 and along a normal bisecting an axis extending between the opposing protrusions and/or detents 158 secures the battery adapter 100 to the receiving area 152 and facilitates alignment thereof. The protrusion and/or detent 160 suitably limits the battery adapter 100 to insertion into the receiving area 152 at an angle with respect to the plane noted above. Moreover, opposing cutouts 162 facilitate alignment of the battery adapter 100. As should be appreciated, these cutouts 154 mate with the opposing tabs 120 of the resilient tray 102.

Disposed within the receiving area 152, the receiving device 150 further includes a plurality of contacts 164 for interfacing with the contacts 138 of the battery adapter 100 when the battery adapter 100 is inserted into the receiving area 152. In certain embodiments, the plurality of contacts 164 of the receiving device 150 include at least three contacts for interfacing with embodiments of the battery adapter 100 equipped with rechargeable batteries. The additional contacts allow the battery adapter 100 to communicate with the receiving device 150. It is contemplated that such communications are employed to provide the receiving device 150 feedback as to the charging state of the batteries 106.

Figure 8:
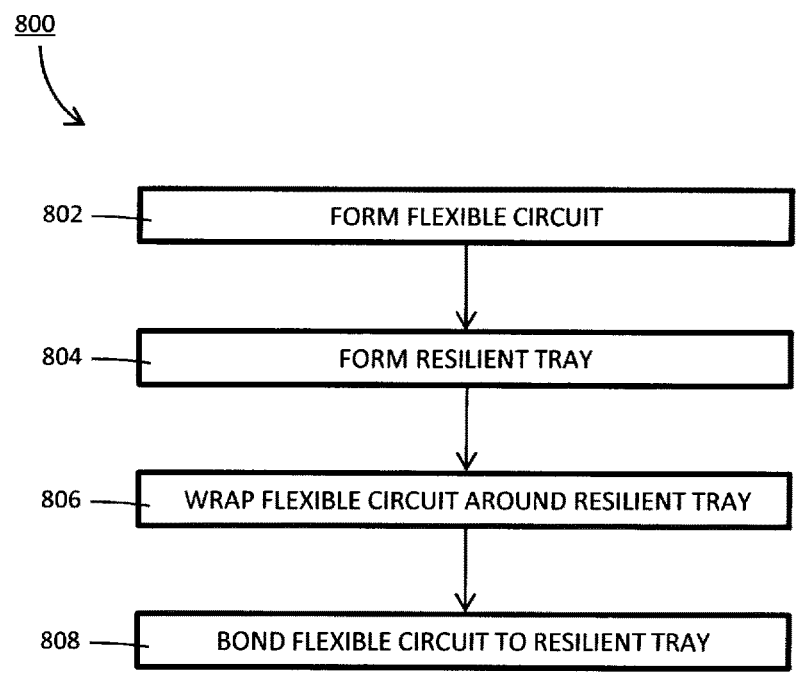
FIG. 8 is a block diagram of a method of manufacturing a battery adapter according to aspects of the present disclosure.

With reference to FIG. 8, a method 800 manufacturing the battery adapter 100 according to aspects of the present disclosure is illustrated. The actions described hereafter are not necessarily dependent upon one another. Further, the illustrated sequence of actions is not to be construed as limiting. Different sequences will be apparent to those skilled in the art.

The flexible circuit 132 is formed 802 using known techniques for forming flexible circuits. For example, in certain embodiments, the flexible circuit 132 is formed from multiple layers. It is contemplated that these layers include one or more insulating layers, one or more conductive layers, and the like. In such embodiments, the conductive layers are etched to define traces and the contacts 134 for interfacing with the receiving device 150 and the batteries 106. The conductive layers are suitably gold, copper, or the like. It is contemplated that the traces interconnect the ones 136 of the plurality of contacts 134 connecting with the batteries 106, e.g., in series. Further, it is contemplated that the contacts 134 are plated with a conducting material, such as a gold material. Insulating layers are suitably placed around and, if appropriate, between the conductive layers, such that only the contacts 134 are exposed. The insulating layers are suitably formed from a polymeric material.

To secure the flexible circuit 132 to the resilient tray 102, the flexible circuit 132 is suitably provided with an adhesive layer. This bond helps prevent contaminants from getting trapped under the flexible circuit 132. The adhesive layer is added to the non-contact side of the flexible circuit 132, and, in certain embodiments, a release liner is disposed over the adhesive layer, such that the release liner is peeled off the adhesive layer when it comes time to adhere the flexible circuit 132 to the resilient tray 102. It is contemplated that the adhesive is a pressure sensitive adhesive Before, after, or contemporaneous with the formation 802 of the flexible circuit 132, the resilient tray 102 is formed 804 of a flexible, compressible material, such as silicone. Traditional injection molding techniques are suitably employed to form 804 the resilient tray 102. In certain embodiments, the formation 804 of the resilient tray 102 includes injecting the flexible, compressible material into a mold. In other embodiment, the formation 804 of the resilient tray 102 includes forming the rigid tray 122. The rigid tray 122 is suitably molded from a chemically resistant thermoplastic material. However, other materials are contemplated. It is contemplated that molding techniques are employed to form the rigid tray 122. After forming the rigid tray 122, the flexible, compressible material is overmolded around at least a part of the rigid tray 122, such that the rigid tray 122 forms a structural skeleton for the resilient tray 102. This involves encasing at least a part of the rigid tray 122 in the flexible, compressible material using, for example, a mold. It is contemplated that the compressible material can completely encase the rigid tray 122 in an overmolding process.

After forming the resilient tray 102, the flexible circuit 132 is wrapped 806 around at least a portion the exterior of the resilient tray 102 and into at the interior thereof. The portion of the flexible circuit 132 extending into the interior of the resilient tray 102 is suitably provisioned to interface with the batteries 106, and the portion of the flexible circuit 132 extending along the exterior of the resilient tray 102 is suitably provisioned to interface with the receiving device 150. Contemporaneous with wrapping 806 the flexible circuit 132 around the resilient tray 102, the flexible circuit 132 is typically secured (or bonded) 808 using the adhesive layer noted above. However, other approaches are contemplated. For example, plugs pressed into the resilient tray 102 can be employed alone or in combination with an adhesive to secure the flexible circuit 132 to the resilient tray 102. In certain embodiments, one or more of the features 112 of the battery adapter 100, such as the protrusions and/or detents 118, facilitate alignment of the flexible circuit 132.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A battery adapter, comprising:
   a resilient tray that defines a receiving area sized to receive one or more removable batteries and includes one or more resilient sidewalls of a resilient material configured to be compressed by the batteries;
   a flexible circuit wrapped around at least a portion of an exterior of the resilient tray over the resilient sidewalls and extending into an interior of the resilient tray;
   a first set of one or more contacts secured to a portion of the flexible circuit, the first set of one or more contacts being disposed on the exterior of the resilient tray to deliver power to an associated device; and
   a second set of one or more contacts electrically coupled with the first set of contacts by the flexible circuit, the second set of contacts being secured to the flexible circuit and disposed on an interior of the resilient sidewalls in the battery receiving area.

2. The battery adapter according to claim 1, wherein the resilient sidewalls are formed at least in part of compressible polymer.

3. The battery adapter according to claim 1, wherein the resilient sidewalls are formed by overmolding silicone on a rigid tray.

4. The battery adapter according to claim 1, wherein the resilient tray includes one or more alignment features facilitating alignment of the battery adapter to the associated device and/or allowing the battery adapter to be secured to the associated device.

5. The battery adapter according to claim 4, wherein the features include opposing recesses and/or wells, wherein the associated device includes opposing protrusions and/or detents provisioned to mate with the opposing recesses and/or wells.

6. A battery adapter comprising:
- a resilient tray that defines a receiving area for one or more batteries and includes one or more resilient sidewalls of a resilient material configured to be compressed by the batteries; and,
- a flexible circuit wrapped around at least a portion of an exterior of the resilient tray over the resilient sidewalls and extending into an interior of the resilient tray;
- a first set of one or more contacts secured to a portion of the flexible circuit, the first set of one or more contacts being disposed on the exterior of the resilient tray to deliver power to an associated device; and
- a second set of one or more contacts electrically coupled with the first set of contacts by the flexible circuit, the second set of contacts being disposed on an interior of the resilient sidewalls in the battery receiving area;
- wherein the battery receiving area of the resilient tray includes a well with a pair of opposite resilient sidewalls, the well being configured to secure the battery adapter with the associated device, the first set of contacts including contacts on the opposite resilient sidewalls for contacting a battery received therebetween.

7. The battery adapter according to claim 6, wherein the resilient material forms a layer at least on the opposite walls behind the contacts such that the resilient material is compressed as a battery is inserted and the compressed resilient material biases the contacts into contact with the inserted battery.

8. The battery adapter according to claim 1, wherein the resilient tray further includes a rigid tray overmolded with the resilient material.

9. The battery adapter according to claim 1, wherein the flexible circuit electrically couples a plurality of the battery contacts in series.

10. A receiving device, comprising:
- a receiving area to receive a battery adapter;
- wherein the battery adapter includes:
  - a resilient tray that defines a receiving area for one or more batteries and includes one or more resilient sidewalls of a resilient material configured to be compressed by the batteries;
  - a flexible circuit wrapped around at least a portion of an exterior of the resilient tray over the resilient sidewalls and extending into an interior of the resilient tray;
  - a first set of one or more contacts secured to a portion of the flexible circuit, the first set of one or more contacts being disposed on the exterior of the resilient tray to deliver power to the receiving device; and
  - a second set of one or more contacts electrically coupled with the first set of contacts by the flexible circuit, the second set of contacts being secured to the flexible circuit and disposed on an interior of the resilient sidewalls in the battery receiving area.

11. The receiving device according to claim 10, wherein the receiving device is a patient worn device.

12. The battery adapter according to claim 6, wherein the second set of contacts are secured to the flexible circuit and disposed on an interior of the resilient sidewalls in the battery receiving area inside the well.

* * * * *